(12) United States Patent
Reina

(10) Patent No.: US 11,929,107 B2
(45) Date of Patent: Mar. 12, 2024

(54) TECHNIQUES FOR MEMORY CELL REFRESH

(71) Applicant: Micron Technology, Inc., Boise, ID (US)

(72) Inventor: Vincenzo Reina, Munich (DE)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 17/712,972

(22) Filed: Apr. 4, 2022

(65) Prior Publication Data

US 2023/0317134 A1    Oct. 5, 2023

(51) Int. Cl.
*G11C 11/40* (2006.01)
*G11C 11/406* (2006.01)
*G11C 11/4074* (2006.01)

(52) U.S. Cl.
CPC .. *G11C 11/40615* (2013.01); *G11C 11/40622* (2013.01); *G11C 11/4074* (2013.01)

(58) Field of Classification Search
CPC ........ G11C 11/40615; G11C 11/40622; G11C 11/4074; G11C 11/402
See application file for complete search history.

(56) References Cited

U.S. PATENT DOCUMENTS

2012/0275256 A1*  11/2012  Furutani  ........... G11C 11/40618
                                                         365/207
2020/0211616 A1*  7/2020  Kim  ..................... G11C 11/406

* cited by examiner

*Primary Examiner* — Han Yang
(74) *Attorney, Agent, or Firm* — Holland & Hart LLP

(57) ABSTRACT

Methods, systems, and devices for techniques for memory cell refresh are described. A memory system may support a low power mode in which the memory system may periodically perform a refresh operation. In some cases, the memory system and a host system coupled with the memory system may support a command to enter the low power mode. As part of the low power mode, the memory system may receive at least one power supply of one or more supported power supplies, such that the memory system may remain active and thus periodically perform the refresh operation. In some cases, the memory system may adjust the periodicity of the refresh operation in response to detecting a triggering event, such as a high temperature, a large system age, or a combination thereof.

25 Claims, 4 Drawing Sheets

TECHNIQUES FOR MEMORY CELL REFRESH

FIELD OF TECHNOLOGY

The following relates to one or more systems for memory, including techniques for memory cell refresh.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
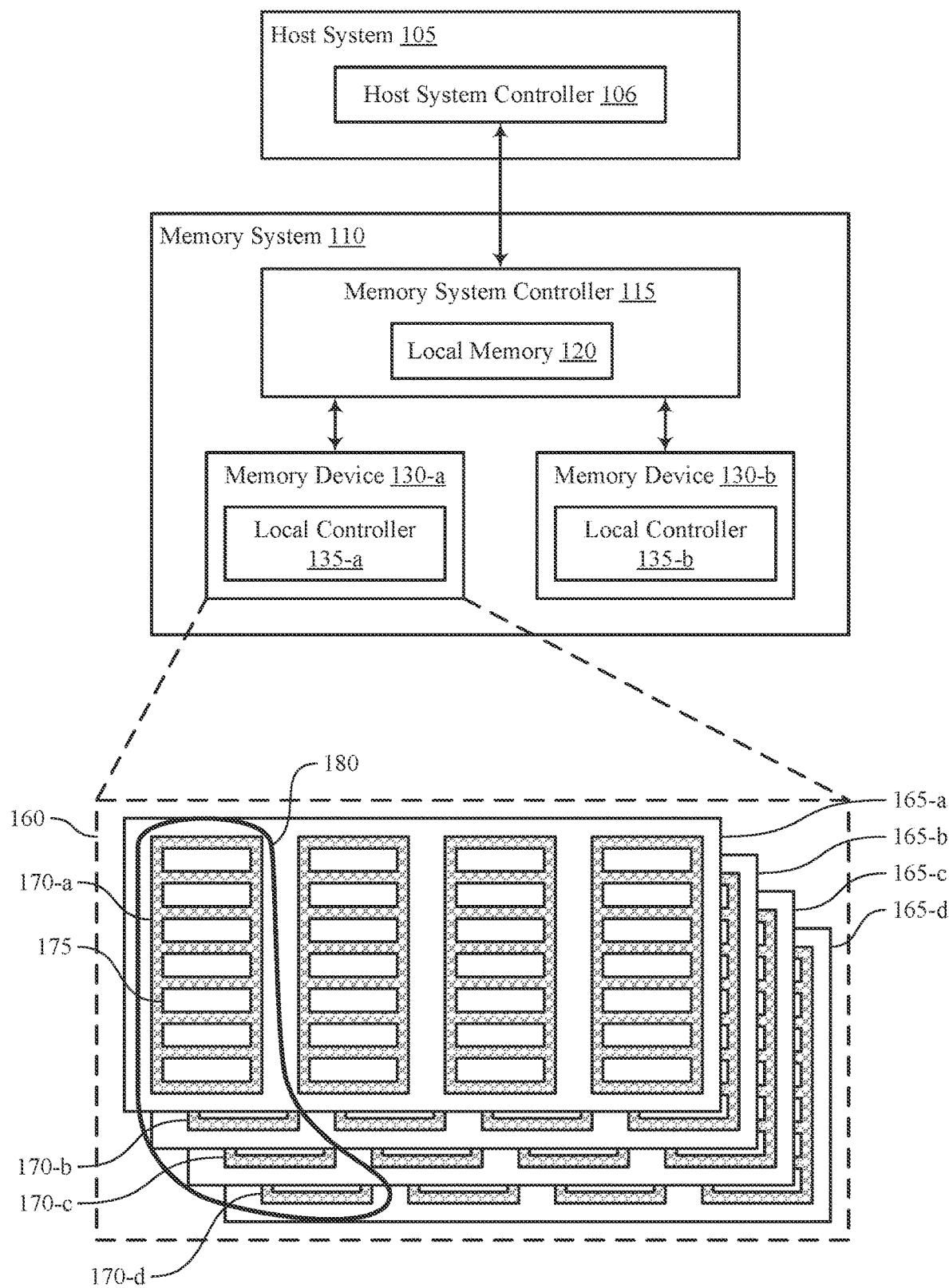
FIG. 1 illustrates an example of a system that supports techniques for memory cell refresh in accordance with examples as disclosed herein.

Some memory systems may be configured to store data for relatively long periods of time (e.g., if the data is stored in non-volatile memory). Over time, data stored in the memory system may become corrupted due to changes in voltage levels of memory cells of the memory system. For example, charge may leak from the memory cells, which may lead to a change in voltage levels of the memory cells. In some cases, factors such as temperature and the age of the memory system may increase this charge loss. Accordingly, a memory system may periodically perform a refresh operation to refresh the memory cells of the memory system to mitigate data corruption. That is, the memory system may periodically access one or more subsets of the memory cells to determine a stored logic state for each memory cell, and may reprogram respective logic states to back to the respective memory cell. In some cases, a memory system may be configured to perform the refresh operation while in a first power mode, such as a high power mode or a stand-by mode. However, if a memory system remains powered down or in a mode other than the high power mode for a significant duration of time (e.g., a duration large enough for the memory system to undergo appreciable charge loss), the stored logic states may be corrupted due to charge loss. Accordingly, a host system or power management system, such as a power management integrated circuit (PMIC), coupled with the memory system may be configured to periodically power on the memory system (e.g., transition the memory system from a low power mode, such as a sleep mode or a powered off mode, to the high power mode), such that the memory system may periodically perform the refresh operations. However, periodically entering the first power mode may consume power or other system resources. Accordingly, techniques to reduce power consumption associated with refreshing memory cells of a memory system are desired.

As described herein, a memory system may support a low power mode (such as a sleep mode or other low power mode associated with less power consumption than the high power mode) in which the memory system may periodically perform a refresh operation. In some cases, the memory system and a host system coupled with the memory system may support a command to enter the low power mode that is associated with performing refresh operations. As part of the low power mode, the memory system may receive at least one power supply of one or more supported power supplies (e.g., from the host system or the PMIC), such that the memory system may remain active and thus periodically perform the refresh operation. In some cases, the memory system may adjust the periodicity of the refresh operation in response to detecting a triggering event, such as the memory system detecting a high temperature, detecting a large system age, or a combination thereof. Accordingly, the memory system may mitigate data corruption associated with charge loss and reduce power consumption.

Features of the disclosure are initially described in the context of systems, devices, and circuits with reference to FIG. 1. Features of the disclosure are described in the context of a process flow with reference to FIG. 2. These and other features of the disclosure are further illustrated by and described in the context of an apparatus diagram and flowchart that relate to techniques for memory cell refresh with reference to FIGS. 3-4.

FIG. 1 illustrates an example of a system 100 that supports techniques for memory cell refresh in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations-which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EE-PROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support techniques for memory cell refresh. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, a memory system 110 may support a low power mode in which the memory system 110 may periodically perform a refresh operation. The low power mode may be an example of a sleep mode or other low power mode associated with less power consumption than a high power mode. In some cases, the memory system 110 and a host system 105 coupled with the memory system 110 may support a command to enter the low power mode. As part of the low power mode, the memory system 110 may receive at least one power supply of one or more supported power supplies, such that the memory system 110 may remain active and thus periodically perform the refresh operation. In some cases, the memory system 110 may adjust the periodicity of the refresh operation in response to detecting a triggering event, such as the memory system 110 detecting a high temperature, detecting a large system age, or a combination thereof. Accordingly, the memory system 110 may mitigate data corruption associated with charge loss and reduce power consumption.

Figure 2:
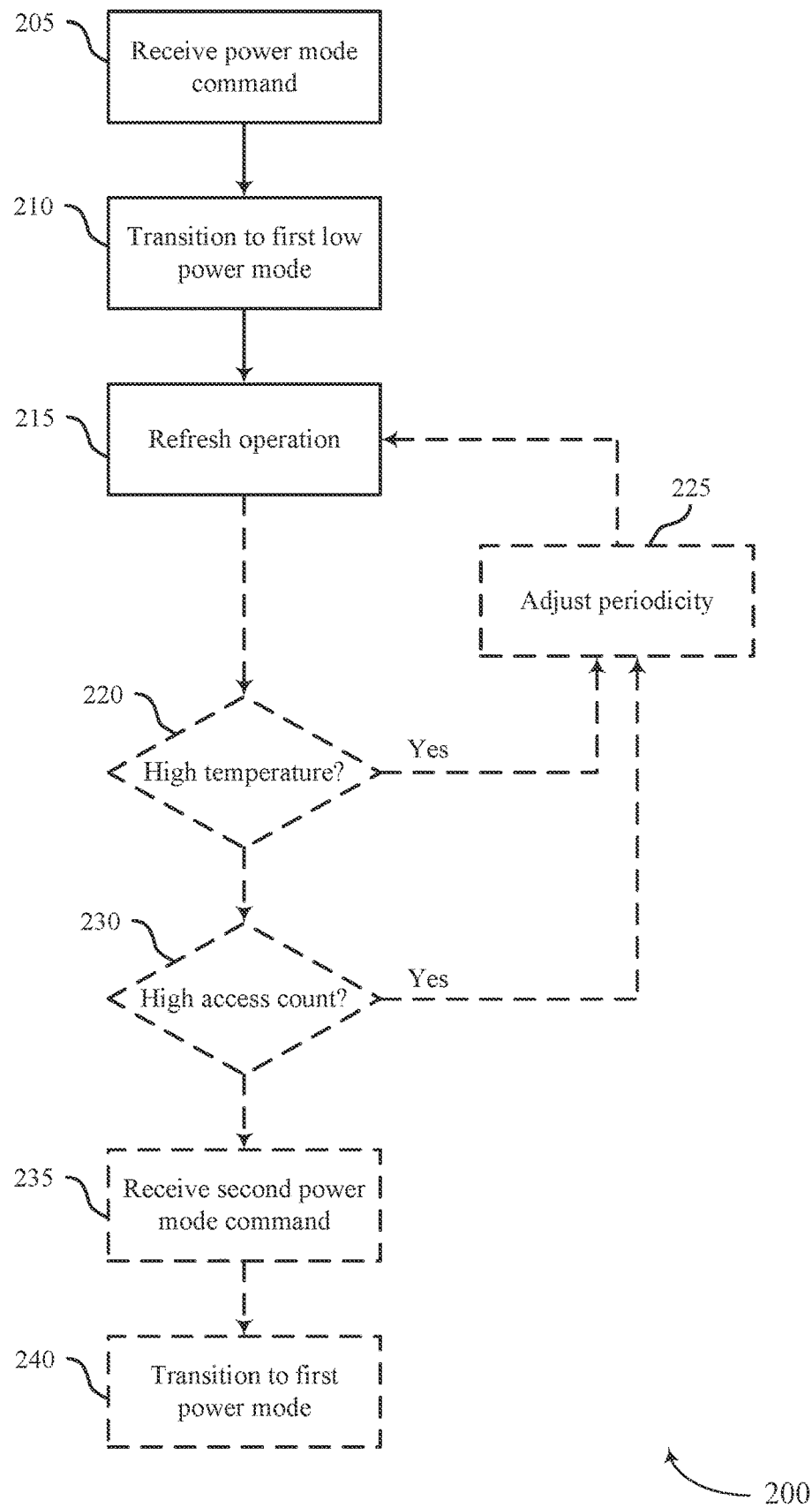
FIG. 2 illustrates an example of a process flow that supports techniques for memory cell refresh in accordance with examples as disclosed herein.

FIG. 2 illustrates an example of a process flow 200 that supports techniques for memory cell refresh in accordance with examples as disclosed herein. The process flow 200 may be implemented by a memory system, for example using a memory system controller, which may be examples of the memory system 110 and memory system controller 115 described with reference to FIG. 1. In the following description of process flow 200, the operations may be performed in a different order than the order shown. For example, specific operations may also be left out of process flow 200, or other operations may be added to process flow 200.

In some cases, the memory system may store data for relatively long periods of time. Accordingly, over time, data stored in the memory system may become corrupted due to changes in voltage levels of memory cells of the memory system. For example, charge may leak from the memory cells over time, which may lead to a change in voltage levels of the memory cells. In some cases, factors such as temperature and memory system age may increase this charge loss. Accordingly, the memory system may periodically perform a refresh operation to refresh the memory cells of the memory system to mitigate data corruption. That is, the memory system may periodically access one or more subsets of the memory cells to determine a stored logic state for each memory cell, and may reprogram respective logic states to back to the respective memory cell.

In some examples, a memory system may be configured to perform the refresh operation while in a first power mode, such as a high power mode or a stand-by mode. However, if a memory system remains powered down for a significant duration of time (e.g., a duration large enough for the memory system to undergo appreciable charge loss), the stored states may be corrupted due to charge loss. Accordingly, a host system or power management system, such as a PMIC, coupled with the memory system may be configured to periodically power on the memory system (e.g., transition the memory system from a low power mode, such as a sleep mode or a powered off mode, to the first power mode), such that the memory system may periodically perform the refresh operations. However, periodically entering the first power mode may consume power or other system resources.

Accordingly, the memory system may be configured to periodically perform the refresh operation while in a low power mode, such as a sleep mode or other low power mode associated with less power consumption than the first power mode. For example, the memory system may support a command to enter a second power mode. As part of the second power mode, the memory system may receive at least one power supply of one or more supported power supplies (e.g., from the host system or the PMIC), such that the memory system may remain active and thus periodically perform the refresh operation.

The process flow 200 may illustrate an example of the memory system entering the second power mode and periodically performing the refresh operation. For example, at 205, the memory system may receive a command (e.g., from a host system) to enter the second power mode. In some cases, the command to enter the low power mode may include a configuration of which power supplies of the one or more power supplies to use, such as an index corresponding to active and inactive power supplies. Additionally or alternatively, the command may include an indication of the periodicity of the refresh operation. For example, the command may include a value corresponding to an initial period of time. Accordingly, as part of the second power mode, the memory system may perform the refresh operation at least once per initial period of time. That is, the command may include an indication of how frequently to perform the refresh operation.

In some cases, the second power mode may be an example of a first low power mode of a plurality of low power modes supported by the memory system. For example, memory system may support a second low power mode, such as a sleep mode. In some cases, the memory system may not be configured to perform the refresh operation in the second low power mode, but may be configured to perform the refresh operation while in the first low power mode.

In some cases, while in the first low power mode, the memory system may receive a first power supply, a second power supply or both from the host system or the PMIC (e.g., so that the memory system may perform the refresh operation). For example, while in the first low power mode, the memory system may receive the first power supply and may not receive the second power supply (e.g., may fail to receive the second power supply). Additionally or alternatively, while in the first low power mode, the memory system may receive the first power supply and the second power supply.

In some cases, while in the second low power mode, the memory system may not receive the first power supply and may not receive the second power supply. Additionally or alternatively, while in the first low power mode, the memory system may receive the first power supply and may not receive the second power supply. Further, while in the first power mode, the memory system may receive the first power supply and the second power supply. In some cases, while in the first power mode, the memory system may receive one or more additionally power supplies (e.g., in addition to the first power supply and the second power supply). In some cases, the first power supply may be an example of an input/output power supply, such as a voltage common collector data output (VCCQ) power supply, while the second power supply may be an example of voltage common collector (VCC) power supply. Accordingly, the first power supply may be associated with a lower supply voltage than the second power supply.

At 210, the memory system may transition to the second power mode (e.g., the first low power mode). In some cases, as part of transitioning to the second power mode, the memory system may deactivate one or more power supplies, for example as indicated by the command received at 205. Accordingly, at 215, the memory system may begin periodically performing the refresh operation. In some cases, the memory system may perform a full refresh by reading each memory cell of the memory system to determine a respective logic state, and subsequently reprogramming the respective logic state to the respective memory cell. Additionally or alternatively, the memory system may perform a partial refresh, such as a scan and refresh. As part of the partial refresh, the memory system may selectively refresh a subset of the memory cells of the memory system if a metric for the subset satisfies a threshold. For example, the memory system may access each block and determine whether a magnitude of charge loss (e.g., voltage drop) associated with the block exceeds a threshold. If the magnitude exceeds a threshold (e.g., if the memory system determines that the block is at risk of data corruption), the memory system may read logic states of memory cells of the block and rewrite the respective logic state to the respective memory cells.

In some cases, as part of the second power mode, the memory system may initiate additional refresh operations (e.g., in addition to the periodic refresh operations), or may adjust the periodicity of the refresh operation based on one or more metrics. For example, at 220, the memory system may determine whether a temperature of the memory system satisfies a threshold. In some cases, a high temperature may increase the rate of charge loss of a memory cell. Accordingly, the memory system may include circuitry and sensors to measure temperature. Thus, if the memory system determines that the temperature exceeds a threshold, the memory system may, at 225, adjust the periodicity of the refresh operation. For example, the memory system may reduce the period, such that the refresh operation may be performed more frequently. In some cases, as part of adjusting the periodicity, the memory system may trigger an additional refresh operation.

In some cases, at 230, the memory system may determine whether a counter associated with a quantity of access operations of a set of memory cells of the memory system satisfies a threshold. In some cases, a memory cell that has been undergone a higher quantity of access operations (e.g., read, write, or erase operations), may experience a higher rate of charge loss than a memory cell that has undergone a lower quantity of access operations, for example due to wear-out or fatigue of the memory cell. Accordingly, if the memory system determines that the value of the counter exceeds a threshold, the memory system may, at 225, adjust the periodicity of the refresh operation. For example, the memory system may reduce the period, such that the refresh operation may be performed more frequently. In some cases, as part of adjusting the periodicity, the memory system may trigger an additional refresh operation.

In some examples, while in the second power mode, the memory system may, at 235, receive a second command from the host system to transition to the first power mode. Accordingly, the memory system may, at 240, transition back to the first power mode, for example by reactivating the one or more power supplies deactivated at 210 (e.g., the memory system may reactivate the second power supply).

In some cases, the memory system may support a second low power mode (e.g., a third power mode) different from the first low power mode. The second low power mode may be an example of a sleep mode, and, in some cases, the memory system may not be configured to perform the refresh operation while in the second low power mode. For example, to enter the second low power mode, the memory system may deactivate both the first power supply and the second power supply. Additionally or alternatively, to enter the second low power mode, the memory system may deactivate the second power supply while maintaining the first power supply. In some cases, the memory system may support a third command different than the first command and different from the second command to enter the second low power mode. For example, the memory system may receive the third command from the host system, and may subsequently transition to the second low power mode.

Aspects of the process flow 200 may be implemented by a controller, among other components. Additionally or alternatively, aspects of the process flow 200 may be implemented as instructions stored in memory (e.g., firmware stored in a memory coupled with the host system or the memory system). For example, the instructions, when executed by a controller, may cause the controller to perform the operations of the process flow 200.

Figure 3:
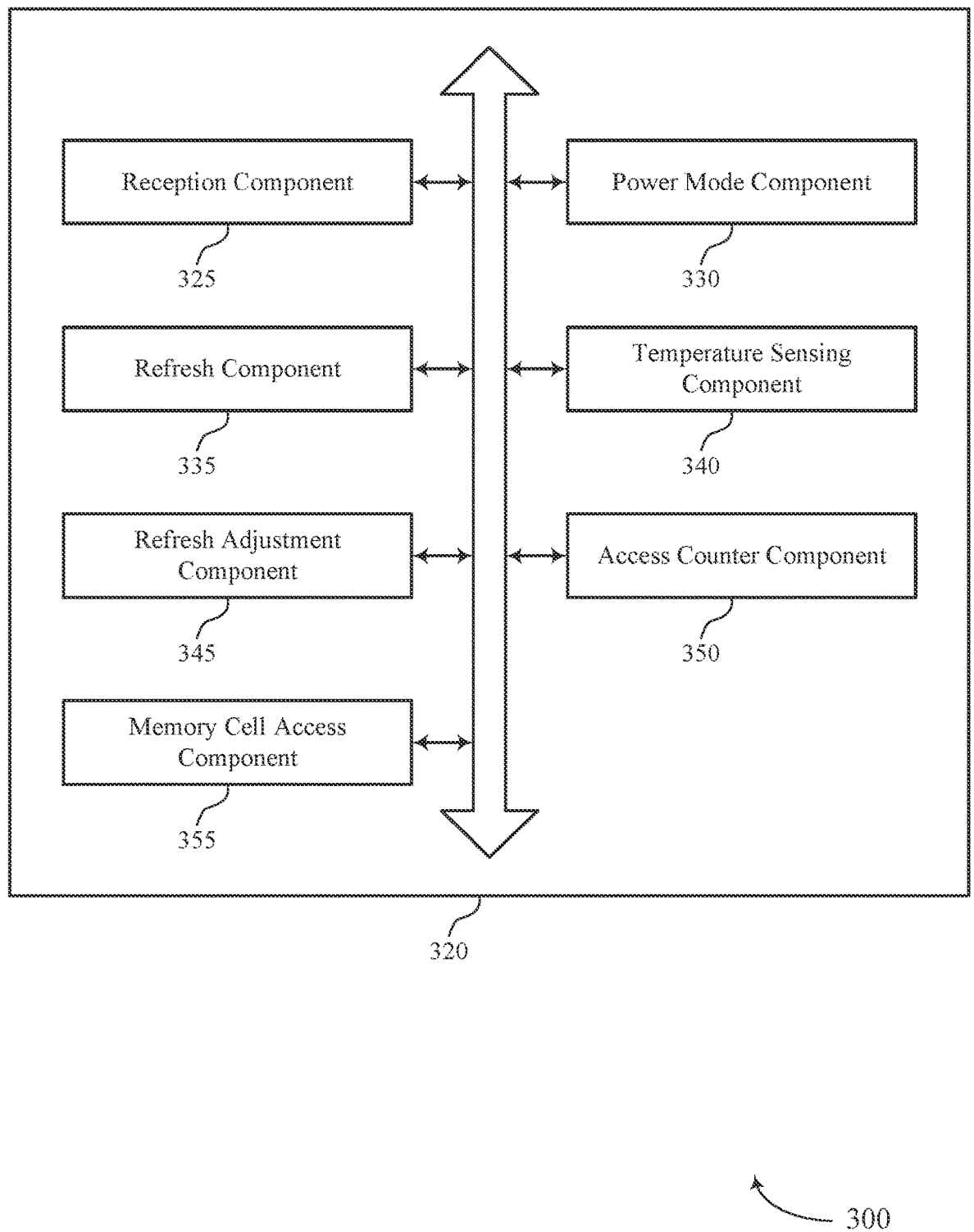
FIG. 3 shows a block diagram of a memory system that supports techniques for memory cell refresh in accordance with examples as disclosed herein.

FIG. 3 shows a block diagram 300 of a memory system 320 that supports techniques for memory cell refresh in accordance with examples as disclosed herein. The memory system 320 may be an example of aspects of a memory system as described with reference to FIGS. 1 through 2. The memory system 320, or various components thereof, may be an example of means for performing various aspects of techniques for memory cell refresh as described herein. For example, the memory system 320 may include a reception component 325, a power mode component 330, a refresh component 335, a temperature sensing component 340, a refresh adjustment component 345, an access counter component 350, a memory cell access component 355, or any combination thereof. Each of these components may communicate, directly or indirectly, with one another (e.g., via one or more buses).

The reception component 325 may be configured as or otherwise support a means for receiving, at a memory system, a command to transition the memory system from a first power mode to a first low power mode of a plurality of low power modes including the first low power mode and a second low power mode. The power mode component 330 may be configured as or otherwise support a means for transitioning to the first low power mode based at least in part on receiving the command. The refresh component 335 may be configured as or otherwise support a means for initiating, based at least in part on a periodicity and during at least a portion of the first low power mode, a refresh operation for the memory system.

In some examples, the first power mode includes receiving a first power supply and receiving a second power supply, the first low power mode includes receiving the first power supply and failing to receive the second power supply, and the second low power mode includes failing to receive the first power supply and failing to receive the second power supply.

In some examples, a voltage of the first power supply is less than a voltage of the second power supply.

In some examples, the first power mode includes receiving a first power supply and receiving a second power supply, the first low power mode includes receiving the first power supply and receiving the second power supply, and the second low power mode includes receiving the first power supply and failing to receive the second power supply.

In some examples, the command includes an indication of the periodicity of performing the refresh operation.

In some examples, the temperature sensing component 340 may be configured as or otherwise support a means for determining whether a temperature of the memory system satisfies a threshold. In some examples, the refresh adjustment component 345 may be configured as or otherwise support a means for adjusting the periodicity to a second periodicity for performing the refresh operation based at least in part on determining that the temperature satisfies the threshold.

In some examples, the access counter component 350 may be configured as or otherwise support a means for determining whether a counter associated with a quantity of access operations of a plurality of memory cells of the memory system satisfies a threshold. In some examples, the refresh adjustment component 345 may be configured as or otherwise support a means for adjusting the periodicity to a second periodicity for performing the refresh operation based at least in part on determining that the counter satisfies the threshold.

In some examples, to support refresh operation, the memory cell access component 355 may be configured as or otherwise support a means for reading one or more logic states of a subset of memory cells of a plurality of memory cells of the memory system. In some examples, to support refresh operation, the refresh component 335 may be configured as or otherwise support a means for determining whether to refresh the subset of memory cells based at least in part on a metric associated with the subset. In some examples, to support refresh operation, the refresh component 335 may be configured as or otherwise support a means for rewriting the one or more logic states to the subset based at least in part on determining to refresh the subset.

In some examples, the reception component 325 may be configured as or otherwise support a means for receiving a second command to transition from the first power mode to the second low power mode. In some examples, the power mode component 330 may be configured as or otherwise support a means for transitioning to the second low power mode based at least in part on receiving the second command.

In some examples, the first power mode includes a stand-by mode and the second low power mode includes a sleep mode.

In some examples, the reception component 325 may be configured as or otherwise support a means for receiving, during at least a portion of the first low power mode, a second command to transition the memory system from the first low power mode to the first power mode. In some examples, the power mode component 330 may be configured as or otherwise support a means for transitioning to the first power mode based at least in part on receiving the second command. In some examples, the reception component 325 may be configured as or otherwise support a means for receiving, during at least a portion of the first power mode, a third command to perform a second refresh operation for the memory system based at least in part on transitioning to the first power mode. In some examples, the refresh component 335 may be configured as or otherwise support a means for performing, during at least a portion of the first power mode, the second refresh operation based at least in part on receiving the third command.

Figure 4:
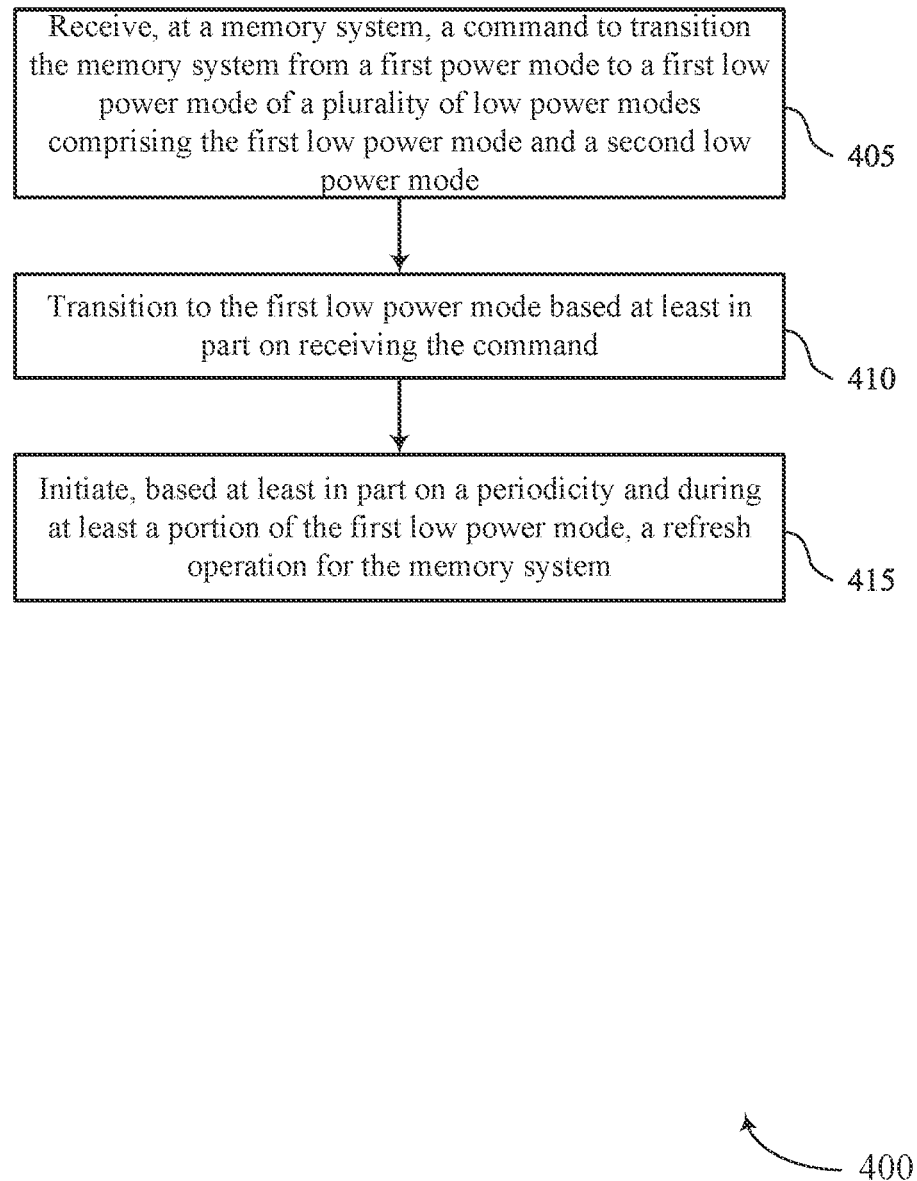
FIG. 4 shows a flowchart illustrating a method or methods that support techniques for memory cell refresh in accordance with examples as disclosed herein.

FIG. 4 shows a flowchart illustrating a method 400 that supports techniques for memory cell refresh in accordance with examples as disclosed herein. The operations of method 400 may be implemented by a memory system or its components as described herein. For example, the operations of method 400 may be performed by a memory system as described with reference to FIGS. 1 through 3. In some examples, a memory system may execute a set of instructions to control the functional elements of the device to perform the described functions. Additionally, or alternatively, the memory system may perform aspects of the described functions using special-purpose hardware.

At 405, the method may include receiving, at a memory system, a command to transition the memory system from a first power mode to a first low power mode of a plurality of low power modes including the first low power mode and a second low power mode. The operations of 405 may be performed in accordance with examples as disclosed herein.

In some examples, aspects of the operations of 405 may be performed by a reception component 325 as described with reference to FIG. 3.

At 410, the method may include transitioning to the first low power mode based at least in part on receiving the command. The operations of 410 may be performed in accordance with examples as disclosed herein. In some examples, aspects of the operations of 410 may be performed by a power mode component 330 as described with reference to FIG. 3.

At 415, the method may include initiating, based at least in part on a periodicity and during at least a portion of the first low power mode, a refresh operation for the memory system. The operations of 415 may be performed in accordance with examples as disclosed herein. In some examples, aspects of the operations of 415 may be performed by a refresh component 335 as described with reference to FIG. 3.

In some examples, an apparatus as described herein may perform a method or methods, such as the method 400. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving, at a memory system, a command to transition the memory system from a first power mode to a first low power mode of a plurality of low power modes including the first low power mode and a second low power mode; transitioning to the first low power mode based at least in part on receiving the command; and initiating, based at least in part on a periodicity and during at least a portion of the first low power mode, a refresh operation for the memory system.

Aspect 2: The method, apparatus, or non-transitory computer-readable medium of aspect 1 where the first power mode includes receiving a first power supply and receiving a second power supply, the first low power mode includes receiving the first power supply and failing to receive the second power supply, and the second low power mode includes failing to receive the first power supply and failing to receive the second power supply.

Aspect 3: The method, apparatus, or non-transitory computer-readable medium of aspect 2 where a voltage of the first power supply is less than a voltage of the second power supply.

Aspect 4: The method, apparatus, or non-transitory computer-readable medium of any of aspects 1 through 3 where the first power mode includes receiving a first power supply and receiving a second power supply, the first low power mode includes receiving the first power supply and receiving the second power supply, and the second low power mode includes receiving the first power supply and failing to receive the second power supply.

Aspect 5: The method, apparatus, or non-transitory computer-readable medium of any of aspects 1 through 4 where the command includes an indication of the periodicity of performing the refresh operation.

Aspect 6: The method, apparatus, or non-transitory computer-readable medium of any of aspects 1 through 5, further including operations, features, circuitry, logic, means, or instructions, or any combination thereof for determining whether a temperature of the memory system satisfies a threshold and adjusting the periodicity to a second periodicity for performing the refresh operation based at least in part on determining that the temperature satisfies the threshold.

Aspect 7: The method, apparatus, or non-transitory computer-readable medium of any of aspects 1 through 6, further including operations, features, circuitry, logic, means, or instructions, or any combination thereof for determining whether a counter associated with a quantity of access operations of a plurality of memory cells of the memory system satisfies a threshold and adjusting the periodicity to a second periodicity for performing the refresh operation based at least in part on determining that the counter satisfies the threshold.

Aspect 8: The method, apparatus, or non-transitory computer-readable medium of any of aspects 1 through 7 where the refresh operation includes operations, features, circuitry, logic, means, or instructions, or any combination thereof for reading one or more logic states of a subset of memory cells of a plurality of memory cells of the memory system; determining whether to refresh the subset of memory cells based at least in part on a metric associated with the subset; and rewriting the one or more logic states to the subset based at least in part on determining to refresh the subset.

Aspect 9: The method, apparatus, or non-transitory computer-readable medium of any of aspects 1 through 8, further including operations, features, circuitry, logic, means, or instructions, or any combination thereof for receiving a second command to transition from the first power mode to the second low power mode and transitioning to the second low power mode based at least in part on receiving the second command.

Aspect 10: The method, apparatus, or non-transitory computer-readable medium of any of aspects 1 through 9 where the first power mode includes a stand-by mode and the second low power mode includes a sleep mode.

Aspect 11: The method, apparatus, or non-transitory computer-readable medium of any of aspects 1 through 10, further including operations, features, circuitry, logic, means, or instructions, or any combination thereof for receiving, during at least a portion of the first low power mode, a second command to transition the memory system from the first low power mode to the first power mode; transitioning to the first power mode based at least in part on receiving the second command; receiving, during at least a portion of the first power mode, a third command to perform a second refresh operation for the memory system based at least in part on transitioning to the first power mode; and performing, during at least a portion of the first power mode, the second refresh operation based at least in part on receiving the third command.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a memory system, a command to transition the memory system from a first power mode to a first low power mode of a plurality of low power modes comprising the first low power mode and a second low power mode;
   transitioning to the first low power mode based at least in part on receiving the command; and
   initiating, based at least in part on a periodicity and during at least a portion of the first low power mode, a refresh operation for the memory system.

2. The method of claim 1, wherein:
   the first power mode comprises receiving a first power supply and receiving a second power supply;
   the first low power mode comprises receiving the first power supply and failing to receive the second power supply; and
   the second low power mode comprises failing to receive the first power supply and failing to receive the second power supply.

3. The method of claim 2, wherein a voltage of the first power supply is less than a voltage of the second power supply.

4. The method of claim 1, wherein:
   the first power mode comprises receiving a first power supply and receiving a second power supply;
   the first low power mode comprises receiving the first power supply and receiving the second power supply; and
   the second low power mode comprises receiving the first power supply and failing to receive the second power supply.

5. The method of claim 1, wherein the command comprises an indication of the periodicity of performing the refresh operation.

6. The method of claim 1, further comprising:
   determining whether a temperature of the memory system satisfies a threshold; and
   adjusting the periodicity to a second periodicity for performing the refresh operation based at least in part on determining that the temperature satisfies the threshold.

7. The method of claim 1, further comprising:
   determining whether a counter associated with a quantity of access operations of a plurality of memory cells of the memory system satisfies a threshold; and
   adjusting the periodicity to a second periodicity for performing the refresh operation based at least in part on determining that the counter satisfies the threshold.

8. The method of claim 1, wherein the refresh operation comprises:
   reading one or more logic states of a subset of memory cells of a plurality of memory cells of the memory system;
   determining whether to refresh the subset of memory cells based at least in part on a metric associated with the subset; and
   rewriting the one or more logic states to the subset based at least in part on determining to refresh the subset.

9. The method of claim 1, further comprising:
   receiving a second command to transition from the first power mode to the second low power mode; and
   transitioning to the second low power mode based at least in part on receiving the second command.

10. The method of claim 1, wherein the first power mode comprises a stand-by mode and the second low power mode comprises a sleep mode.

11. The method of claim 1, further comprising:
receiving, during at least a portion of the first low power mode, a second command to transition the memory system from the first low power mode to the first power mode;
transitioning to the first power mode based at least in part on receiving the second command;
receiving, during at least a portion of the first power mode, a third command to perform a second refresh operation for the memory system based at least in part on transitioning to the first power mode; and
performing, during at least a portion of the first power mode, the second refresh operation based at least in part on receiving the third command.

12. An apparatus, comprising:
a controller associated with a memory device and configured to cause the apparatus to:
receive, at a memory system, a command to transition the memory system from a first power mode to a first low power mode of a plurality of low power modes comprising the first low power mode and a second low power mode;
transition to the first low power mode based at least in part on receiving the command; and
initiate, based at least in part on a periodicity and during at least a portion of the first low power mode, a refresh operation for the memory system.

13. The apparatus of claim 12, wherein:
the first power mode comprises receiving a first power supply and receiving a second power supply;
the first low power mode comprises receiving the first power supply and failing to receive the second power supply; and
the second low power mode comprises failing to receive the first power supply and failing to receive the second power supply.

14. The apparatus of claim 13, wherein a voltage of the first power supply is less than a voltage of the second power supply.

15. The apparatus of claim 12, wherein the command comprises an indication of the periodicity of performing the refresh operation.

16. The apparatus of claim 12, wherein the controller is further configured to cause the apparatus to:
determine whether a temperature of the memory system satisfies a threshold; and
adjust the periodicity to a second periodicity for performing the refresh operation based at least in part on determining that the temperature satisfies the threshold.

17. The apparatus of claim 12, wherein the controller is further configured to cause the apparatus to:
determine whether a counter associated with a quantity of access operations of a plurality of memory cells of the memory system satisfies a threshold; and
adjust the periodicity to a second periodicity for performing the refresh operation based at least in part on determining that the counter satisfies the threshold.

18. The apparatus of claim 12, wherein the refresh operation is configured to cause the apparatus to:
read one or more logic states of a subset of memory cells of a plurality of memory cells of the memory system;
determine whether to refresh the subset of memory cells based at least in part on a metric associated with the subset; and
rewrite the one or more logic states to the subset based at least in part on determining to refresh the subset.

19. The apparatus of claim 12, wherein the controller is further configured to cause the apparatus to:
receive a second command to transition from the first power mode to the second low power mode; and
transition to the second low power mode based at least in part on receiving the second command.

20. The apparatus of claim 12, wherein the first power mode comprises a stand-by mode and the second low power mode comprises a sleep mode.

21. The apparatus of claim 12, wherein the controller is further configured to cause the apparatus to:
receive, during at least a portion of the first low power mode, a second command to transition the memory system from the first low power mode to the first power mode;
transition to the first power mode based at least in part on receiving the second command;
receive, during at least a portion of the first power mode, a third command to perform a second refresh operation for the memory system based at least in part on transitioning to the first power mode; and
perform, during at least a portion of the first power mode, the second refresh operation based at least in part on receiving the third command.

22. A non-transitory computer-readable medium storing code, the code comprising instructions executable by a processor to:
receive, at a memory system, a command to transition the memory system from a first power mode to a first low power mode of a plurality of low power modes comprising the first low power mode and a second low power mode;
transition to the first low power mode based at least in part on receiving the command; and
initiate, based at least in part on a periodicity and during at least a portion of the first low power mode, a refresh operation for the memory system.

23. The non-transitory computer-readable medium of claim 22, wherein:
the first power mode comprises receiving a first power supply and receiving a second power supply;
the first low power mode comprises receiving the first power supply and failing to receive the second power supply; and
the second low power mode comprises failing to receive the first power supply and failing to receive the second power supply.

24. The non-transitory computer-readable medium of claim 23, wherein a voltage of the first power supply is less than a voltage of the second power supply.

25. The non-transitory computer-readable medium of claim 22, wherein the command comprises an indication of the periodicity of performing the refresh operation.

* * * * *